United States Patent
Quaglietta et al.

(10) Patent No.: US 6,600,179 B2
(45) Date of Patent: Jul. 29, 2003

(54) POWER AMPLIFIER WITH BASE AND COLLECTOR STRAPS

(75) Inventors: Anthony Francis Quaglietta, Methuen, MA (US); Allen William Hanson, Pepperell, MA (US); Thomas Aaron Winslow, Roanoke, VA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/004,309

(22) Filed: Nov. 1, 2001

(65) Prior Publication Data

US 2003/0080349 A1 May 1, 2003

(51) Int. Cl.[7] ............... H01L 31/0328; H01L 31/0336; H01L 31/072; H01L 31/109
(52) U.S. Cl. .............. 257/197; 257/276; 257/565; 257/571; 257/579
(58) Field of Search .................. 257/276, 197, 257/565, 571, 579

(56) References Cited

U.S. PATENT DOCUMENTS

| | | | | |
|---|---|---|---|---|
| 5,084,750 A | * | 1/1992 | Alderstein | 257/197 |
| 5,648,278 A | * | 7/1997 | Bayraktaroglu | 438/317 |
| 5,939,739 A | * | 8/1999 | O'Keefe | 257/197 |
| 6,051,871 A | * | 4/2000 | DeLaCruz et al. | 257/571 |
| 6,057,567 A | * | 5/2000 | Bayraktaroglu | 257/197 |
| 6,121,842 A | * | 9/2000 | Adlerstein et al. | 257/565 |
| 6,410,396 B1 | * | 6/2002 | Casady et al. | 257/197 |

* cited by examiner

*Primary Examiner*—David Nelms
*Assistant Examiner*—Tu-Tu Ho
(74) *Attorney, Agent, or Firm*—Brinks Hofer Gilson & Lione (57) ABSTRACT

A semiconductor amplifier includes collector straps that form air bridges over a set of transistors and make parallel electrical connections between the collectors of the transistor and collector contact pad. Base straps establish base bias and electrically connect a dc current source with bases of the transistors through resistive elements.

52 Claims, 6 Drawing Sheets

POWER AMPLIFIER WITH BASE AND COLLECTOR STRAPS

BACKGROUND

In recent years there has been substantial growth of mobile communications devices, primarily cellular telephones and personal digital assistants. These devices demand ever-increasing power added efficiency (PAE) to achieve long battery life in support of increased talk times. The transmitting amplifiers in these devices have in recent years, migrated to gallium arsenide (GaAs) heterojunction bipolar transistors (HBT) technology. One advantage HBTs provide is the ability to effect high power densities across small areas. Compound semiconductors GaAs and indium phosphide (InP) based binary, ternary or quaternary alloys work well in this regard and may provide an advantage over the silicon-based devices found in most applications. However, one disadvantage of compound semiconductors is the relatively poor thermal conductivity in comparison to silicon, causing self-heating of the individual devices that may result in unstable operation.

In addition to the reduced battery power requirements, the size of cellular phones and the corresponding circuitry within has continually decreased. However, the transmitting power requirements of the devices remain the same in order to maintain clear communication signals. The reduced circuitry size together with transmitting power requirements produce increased power densities, which, when coupled with the problem of heat removal, result in higher operational temperatures for these devices and further degrade the long-term reliability of the device.

To maintain the performance of the transistor for large power applications, typically the transistor is divided into many small transistors electrically tied together in parallel. However, thermal stability becomes more challenging with a greater number of transistors and associated transistor fingers used to input to signals to and output signals from the transistor. Specifically, the devices near the center of an array of transistors tend to run at a higher temperature than those at the edge of the array, leading to poor overall thermal stability. This issue is commonly addressed in power amplifiers implemented with bipolar transistor technology by the application of distributed ballast resistors as reducing the overall thermal resistance of the transistor can also improve matters of thermal stability.

The process of making an HBT starts the depositing of epitaxial crystalline layers that form the active material of the individual HBT. The follow-on processing steps delineate each of the transistors by masking and etching away transistor material from the area of the wafer. This provides a method of electrically contacting the collector, base, and emitter layers of the HBT. The routing of signals through electrodes across the amplifier and the insulating material are done to minimize capacitances and inductances.

One of the problems with the current technology, however, is the inefficiency of the device layout and in the use of valuable epitaxial transistor material as a substrate base for interconnects, electrodes and various other passive elements, which results in inefficient use of die area. The interconnects are patterned on material that might otherwise provide additional transistors, thereby allowing the more valuable wafer area to be put to better use. It would thus be advantageous to provide a reduced size device that reduces manufacturing costs by the realization of more die from a given wafer and a method of producing such a device. It would also be of advantage to remove the heat from the active device efficiently so that device operation is not impaired, allow for a more stable environment for radio-frequency ("RF") signal amplification, and provide a more efficient and compact method to distribute dc bias among the many transistor cells.

BRIEF SUMMARY

In one embodiment, the semiconductor amplifier comprises at least one amplifier cell including a plurality of transistors cells on a substrate and at least one collector strap that forms an air bridge over a set of the transistors. A contact pad may provide a signal output for collectors of the transistors, with the collector strap making electrical connections between the collectors and the contact pad.

An adjacent pair of transistors may share collector contact material and a subcollector. One bridge of the collector strap may be connected with collector contact material of a first adjacent pair of transistors and a neighboring second adjacent pair of transistors. The bridge of the collector strap may span one of the transistors of the first adjacent pair of transistors and one of the transistors of the second adjacent pair of transistors.

In a second embodiment, the amplifier may include a ground disposed on a back side of the substrate with the amplifier cell being arranged on a front side of the substrate, a plurality of electrodes electrically connected with emitters of the transistors, and a plurality of ground vias through the substrate. The ground vias may be connected with the electrodes and allow at least one of direct (DC) and radio-frequency (RF) current flow to the grounded conductive layer. The emitters of a neighboring pair of transistors may be connected through one of the electrodes to a corresponding via. The transistors may be aligned in rows and the vias may be adjacent to every other row of the transistors.

In a third embodiment, the amplifier may include a plurality of resistive elements connected with bases of the transistors and at least one base strap connecting the resistive elements and forming an air bridge over the resistive elements. Adjacent pairs of transistors may share one resistive element. Capacitors may be connected with the bases of the transistors and a symmetrical interstage feed, which is configured to receive an input signal and configured to supply the input signal to the capacitors. In addition, a bias circuit may be added to adjust the transistors DC current.

DETAILED DESCRIPTION

While some potential solutions to reduce the problem of thermal resistance include use of a flip-chip to remove the heat from the top of the device, this method has a number of practical manufacturing issues including increased processing steps and expense. Other solutions use conduction of the heat away from the transistor through a thermally conductive material (most commonly a metal such as gold) in an effort to dissipate the heat over a wider area. This helps to alleviate the heating of the interior transistors providing for a stable operation but also requires increased area, and thus is costly. Others thin the substrate to reduce the thermal resistance under the transistor, but this increases the fragility of the substrate.

In an embodiment of the present invention, a high performance amplifier is shown and described that can be used in handset cellular telephones and other wireless devices. The amplifier includes power heterojunction bipolar transistors whose collectors and bases are each respectively commonly connected using air bridges. Air bridges are interconnections between individual electronic elements that utilize vertical space above the substrate rather than lateral space on the substrate. The spans of the air bridge are separated from the electronic components on the substrate below, including transistors, resistors, and interconnects, by air. The use of air bridges decreases the size of the amplifier and die and allows multiple large vias that form electrical ground to be disposed in close proximity to the transistors, thereby increasing the efficiency of heat dissipation and reducing the inductance to ground. The reduction in size is approximately the width of the air bridge used. The reduction in inductance to ground is beneficial to the electrical stability and radio frequency (RF) performance of the amplifier. The positioning of the electrodes allows the emitter contacts to conduct current to ground and to conduct the resultant heat through multiple vias to the backside ground plane (metal) of the substrate. One benefit of these embodiments is the increased number of die or amplifiers obtained from an individual wafer since a reduced thermal resistance allows for a tighter spacing of the transistors. This particular benefit greatly reduces manufacturing costs.

Figure 1:
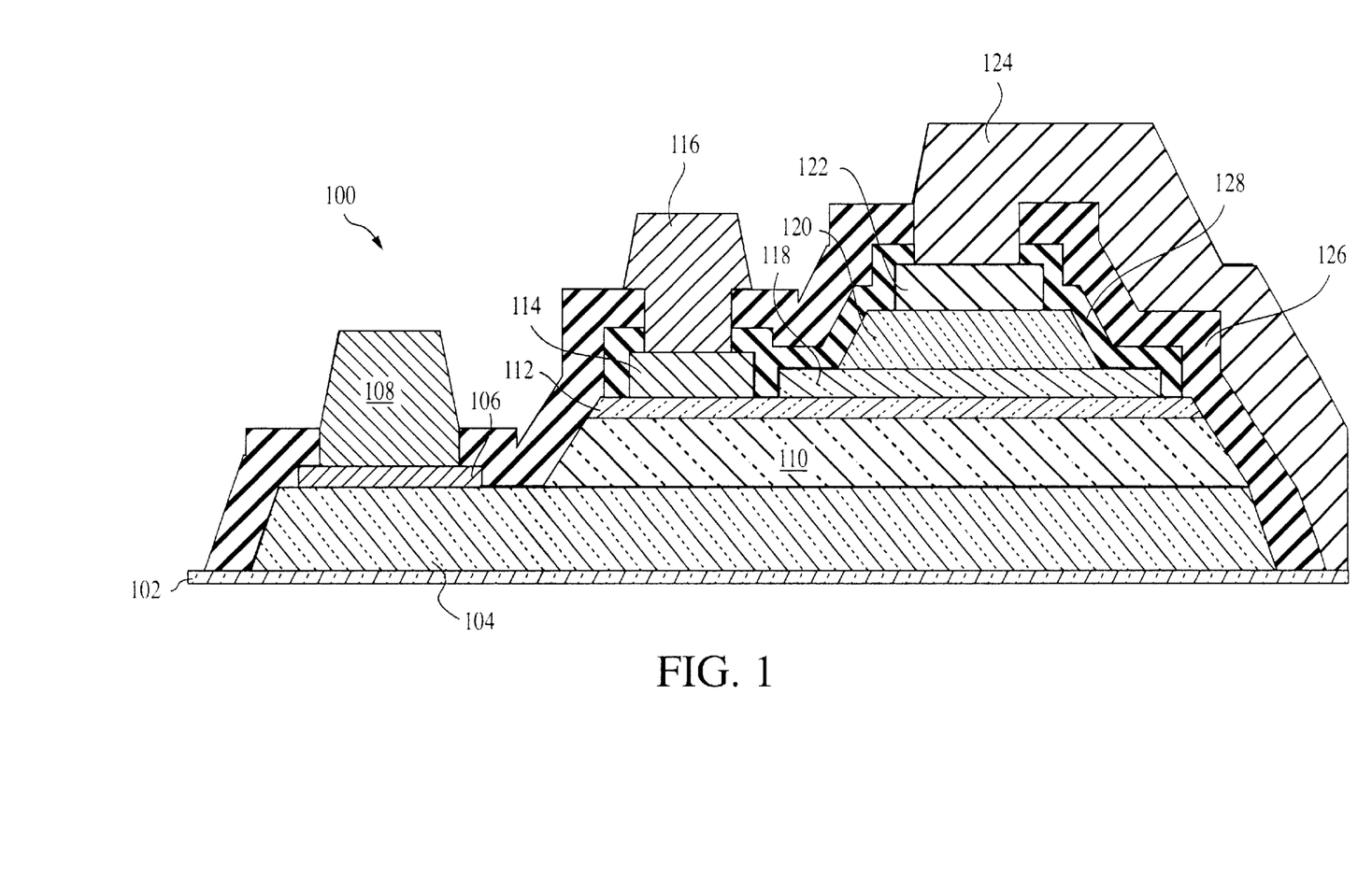
FIG. 1 shows a cross-sectional view of a heterojunction bipolar transistor cell according to one embodiment.

FIG. 1 illustrates a cross sectional view of a heterojunction bipolar transistor (HBT) cell 100 according to an embodiment. The transistor cell 100 is fabricated in a mesa structure atop a substrate 102 of a semi-insulating semiconductor. The transistor cell 100 is typically formed by epitaxial growth techniques and then processed using conventional optical lithographic processes (for example exposure, pattern development, cleaning, metallization) all of which are well known in the art. The HBT cell 100 herein is InGaP/GaAs based, other structures may use different material systems, for example III-V compound semiconductor systems such as GaAs/AlGaAs, InGaAs/InP, or InP/GaAsSb, or elemental systems such as SiGe. The material characteristics, such as doping, and processes used to fabricate transistors are all well known in the art of semiconductor fabrication and are not therefore provided.

The transistor cell 100 includes a substrate 102 that provides mechanical support for the transistor and provides a medium through which a majority of the heat generated by the circuitry is dissipated. A subcollector region (subcollector) 104 is disposed on the substrate 102 and a collector region (collector) 110 is disposed on the subcollector 104. The subcollector 104 provides good electrical conductivity between the collector contact 106 and the collector 110. A base region (base) 112 is disposed on the collector 110 and an emitter region (emitter) 120 over the base 112. A collector contact 106 is disposed on the subcollector 104, adjacent to the collector 110, and interconnect collector metallization (collector interconnect) 108 is disposed on the structure. Similarly, a base contact 114 makes contact with interconnect base metallization (base interconnect) 116. Base contact 114 is disposed on the base 112 and interconnect emitter metallization (emitter interconnect) 124 connects the emitter contact 122 disposed on the emitter 120. A ledge region (ledge) 118 may be disposed between the base 112 and emitter 120, dependent on the material system. A first insulating/passivation layer 128 is disposed on the base 112 and surrounds the layers on the base 112. A second insulating/passivation layer 126 is disposed over the entire transistor, excluding the metallizations. Contacts to the respective regions of the transistor 100 may be formed by etching contact holes in the insulating layers 126 and 128, depositing metallization, and then lifting off the excess metallization. The same interconnection metallization layer is used to form the separate interconnect metallization to the collector (108), base (116) and emitter (124).

The collector contact 106, like the base and emitter contacts 114 and 122, provides better adherence of the metallization to the respective contact while simultaneously providing good electrical conductivity between the metallization and the respective contact. The collector, base, and emitter metallizations 108, 116, and 124 are also called electrodes or interconnects.

The insulating/passivation layers 126 and 128 are formed from a suitable dielectric material. The first and second insulating/passivation layers 126 and 128 are preferably SiN, although other materials ($SiO_2$, polyimide, BCB) may be used dependent on the design and underlying material system. The first insulating layer 128 in the embodiment shown is thinner than the second insulating layer 126. In one example, the thickness of the first insulating layer 128 may be about 50 nm while that of the second insulating layer 126 may be about 150 nm. However, the number of insulating layers, the thickness of these layers and the compositions may vary dependent on the device and material characteristics among others.

Figure 2:
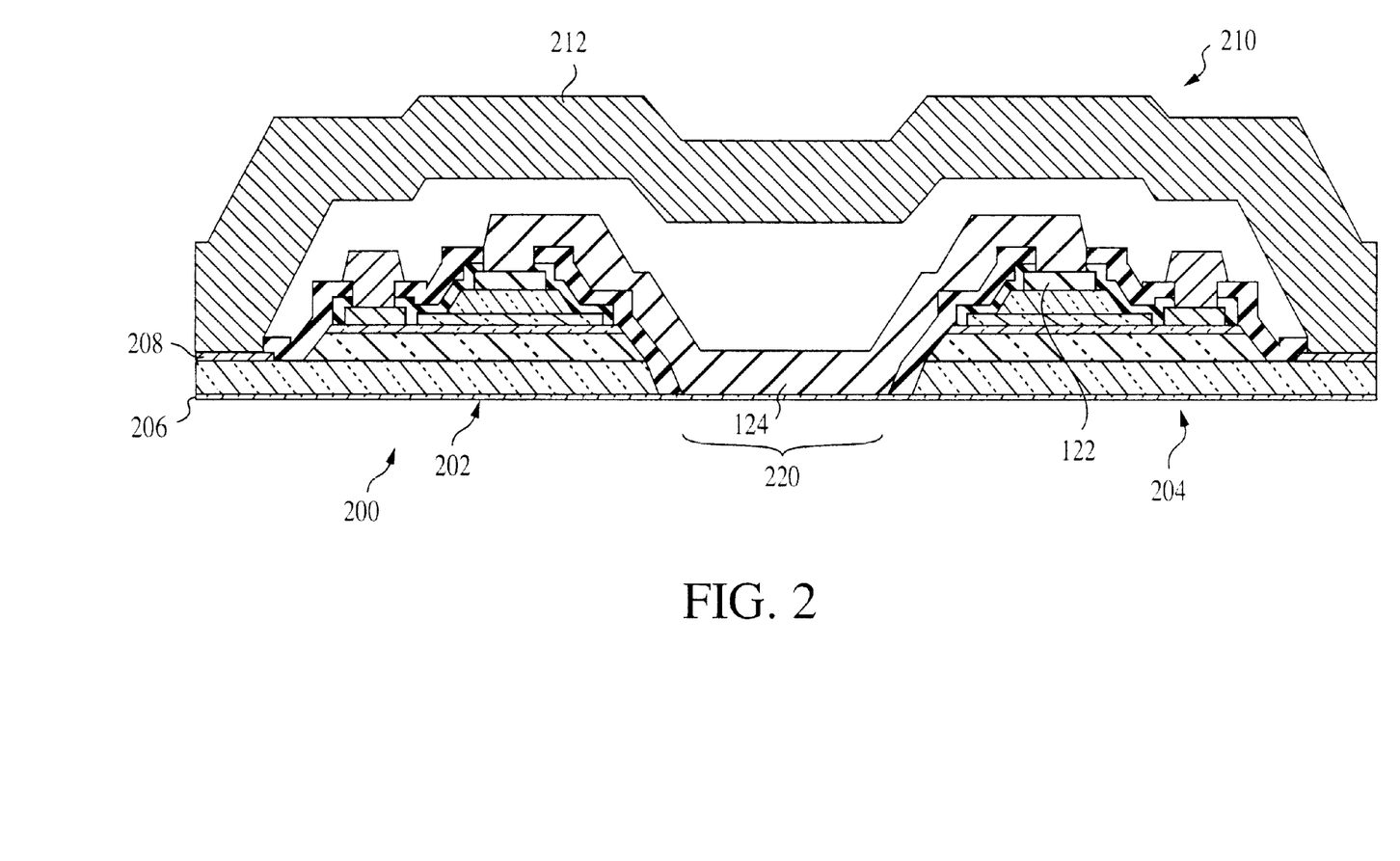
FIG. 2 is a cross-sectional view of one transistor cell according to one embodiment.

FIG. 2 illustrates a cross-section through a collector strap 210 that spans a pair of transistor cells 200 and connects the collectors of the pair of transistor cells 200. The transistor cells 200 are aligned in pairs that oppose each other. The emitter electrode 124 from a first transistor 202 of the paired transistor cells is connected with a second transistor 204 of the paired transistor cells. The connected paired emitters may also be called a conductive interconnect 124. This conductive interconnect 124 both spreads heat from the emitters and grounds the emitters of the individual transistor cells 202 and 204 to which it is connected.

Figure 4:
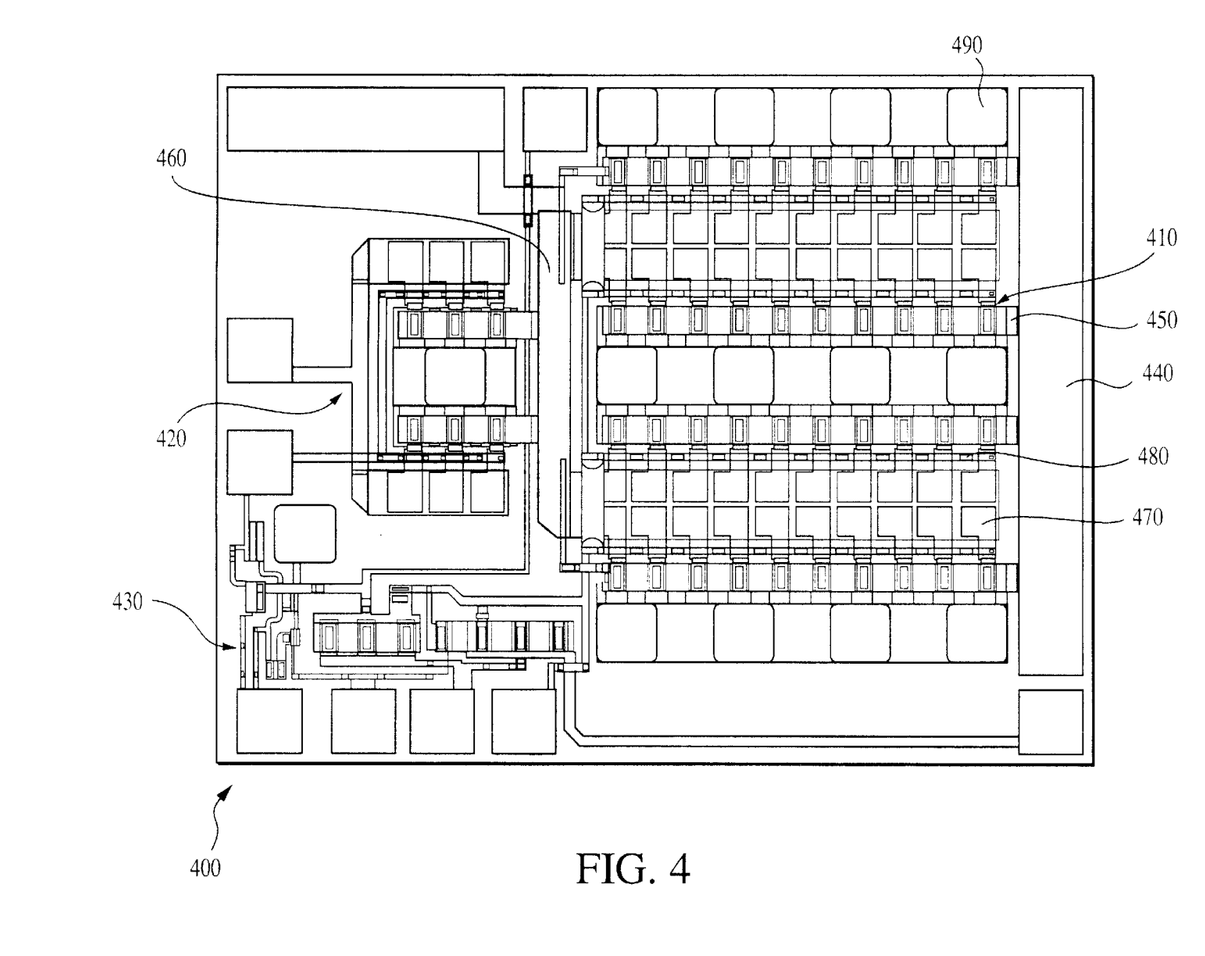
FIG. 4 shows a top view of an amplifier according to an embodiment prior to packaging.

A common region 220 adjacent to the paired transistor cells 202 and 204 is devoid of the layers that form the transistor cell (e.g. the subcollector, collector), having previously been removed by an etch process. The emitter interconnects 124 extend from the emitter contact 122 over the insulating layers 126 and 128 and connect in this adjacent region 220. The emitter interconnects 124 also electrically and thermally connect with ground vias 490 along conductive patterns (not shown). The ground vias 490, which are located out-of-plane and thus not illustrated in FIG. 2, are shown in FIG. 4. The emitter interconnects 124 may be formed from any conductor well known in the art, such as TiPtAu, Cu, or Al.

Similar to the emitter interconnect 124, the collector interconnect 212 of the paired transistor cells 202 and 204 is in electrical contact with the collector interconnect of other transistor cells. However, while the emitter interconnects 124 are disposed on the surface of the substrate 206, the collector interconnects 212 are connected as an air bridge 210 that spans both of the paired transistor cells 202 and 204 as well as including the region adjacent 220 to the paired transistor cells 202 and 204. The collector interconnects 212 are connected to the subcollectors 104 through contact pads 208. The collector interconnects 212 may be formed from any conductor well known in the art, such as TiPtAu, Cu, or Al.

The method of forming an air bridge 210 is well known in the art of semiconductor fabrication. To fabricate the collector air bridge 210, for example, a sacrificial layer of positive or negative photoresist is first formed above the transistor cells 202 and 204 and adjacent region 220. To form the sacrificial layer, both a post layer, which defines the contact between the collector straps 212 and the underlying metal, and a span layer, which defines the lateral dimensions of the collector straps 212, is used. After the photoresist is formed, the interconnects are fabricated by deposition or plating, and then the photoresist layer is removed using a solvent, such as acetone, leaving the air gap. The air bridges 210 according to an embodiment span the mesas of multiple transistor cells.

Figure 3:
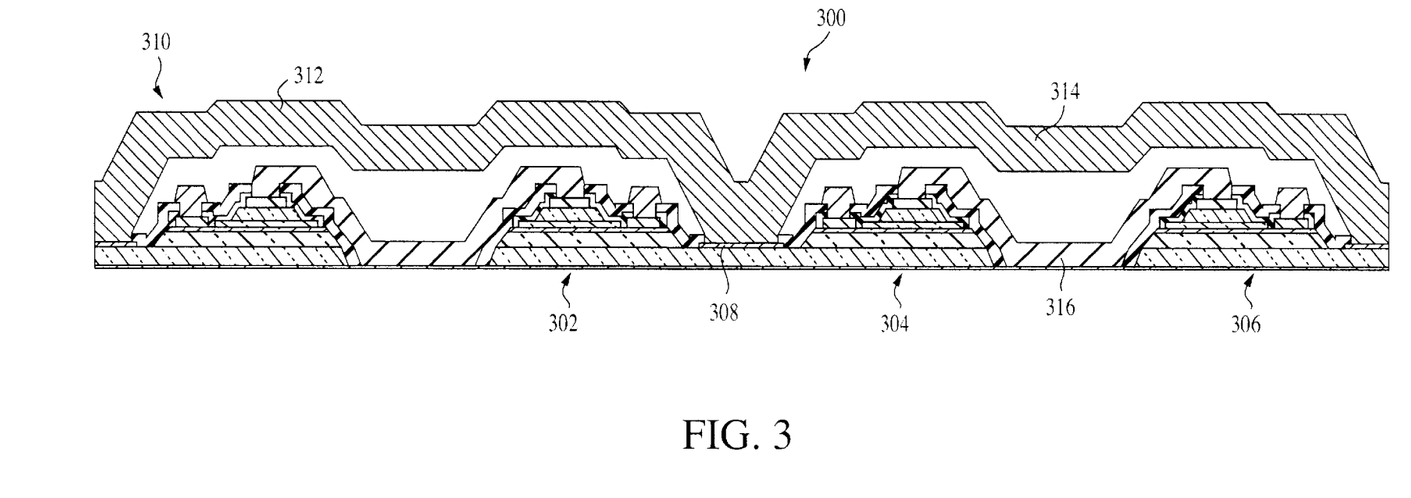
FIG. 3 illustrates a cross sectional view of a collector strap spanning several transistor cells according to one embodiment.

An extended cross sectional view of multiple transistor cells 302, 304, 306 and interconnects between the transistor cells 302, 304, 306 in an amplifier 300 are illustrated in FIG. 3. In the cross-sectional view of FIG. 3, both adjacent transistor cells 302 and 304 and neighboring transistor cells 304 and 306 are shown. The collector interconnects 312 and 314 are connected together at the associated collector contact 308 to form the air bridges that compose the collector strap 310. Adjacent transistor cells 302 and 304 that do not share a common emitter interconnect 316 share a common collector contact 308. Thus, the air bridges 312 of a particular collector strap 310 connect the shared collector contact material 308 (and subcollector material) of adjacent transistor cells 302 and 304, with the bridge spanning (i.e. vertically overlapping) one of the transistor cells 304 in the paired adjacent transistor cells 302 and 304 and a neighboring transistor 306 of another set of paired adjacent transistor cells. Further, the transistor cells 302 and 304 that share a common collector contact 308 also share a common base ballast resistor, as will be described below.

Figure 5:
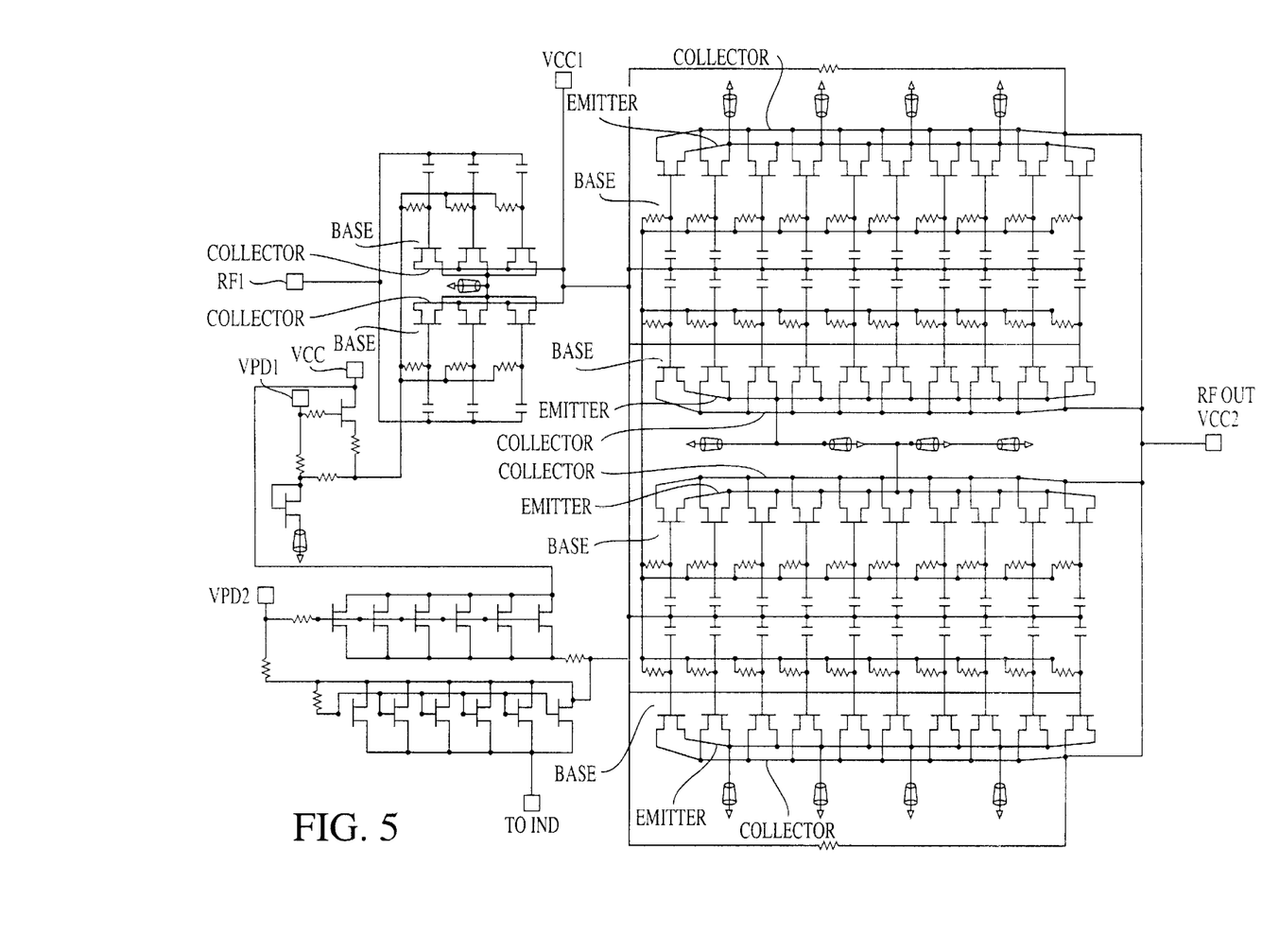
FIG. 5 is the electrical schematic of an amplifier according to one embodiment.

A top view of an amplifier 400 according to an embodiment is shown in FIG. 4 and an electrical schematic view of the amplifier 400 is shown in FIG. 5. The amplifier 400 includes at least one main amplifier cell 410 that includes a plurality of transistor cells, such as the transistor cells 202, 204 of FIG. 2, aligned in one or more rows. The transistor cells shown in FIG. 2 are disposed below the collector straps 450 in the amplifier 400.

In addition to the at least one main amplifier cell 410, the amplifier 400 includes a pre-amplifier circuit (pre-amplifier) 420 and a stabilization circuit 430. The pre-amplifier, or first stage amplifier, 420 is configured to receive an input signal and configured to output a pre-amplified signal into the amplifier cells 410. The pre-amplifier 420 includes an amplifier cell having a reduced number of transistor cells and associated connected elements as compared with each of the main amplifier cells or second stage amplifier 410. The bias circuit 430 establishes a DC current for both stages of the amplifier 400, the pre-amplifier 420 and the main amplifier cells 410. Additionally, the bias circuit 430 provides some benefit to the thermal stability of the DC bias current since changes in the characteristics of the bias circuit 430 as a function of temperature will track those of the amplifying stages 410 and 420. While the pre-amplifier 420 and bias circuit 430 are connected with the bases of the transistor cells of each amplifier cell 410, a common output connecting pad 440 is connected with the collectors of the transistor cell of the second stage amplifier 410.

In each row of transistor cells, the collectors of the transistors in the row are connected in parallel by a collector strap 450, which spans the individual devices of that row. The collector straps 450 in turn are connected to the common output connecting pad 440 at different locations. Thus, the common output connecting pad 440 is configured to receive RF signals output from the transistor cells. Output signals of the amplifier 400 are extracted from the common output connecting pad 440 and provided to external elements (not shown).

Similarly, the pre-amplifier 420 is configured to provide pre-amplified signals to a symmetrical interstage feed 460 that then distributes the pre-amplified signals to capacitors 470 connected with the bases of the transistor cells in the amplifier cells 410.

Figure 6:
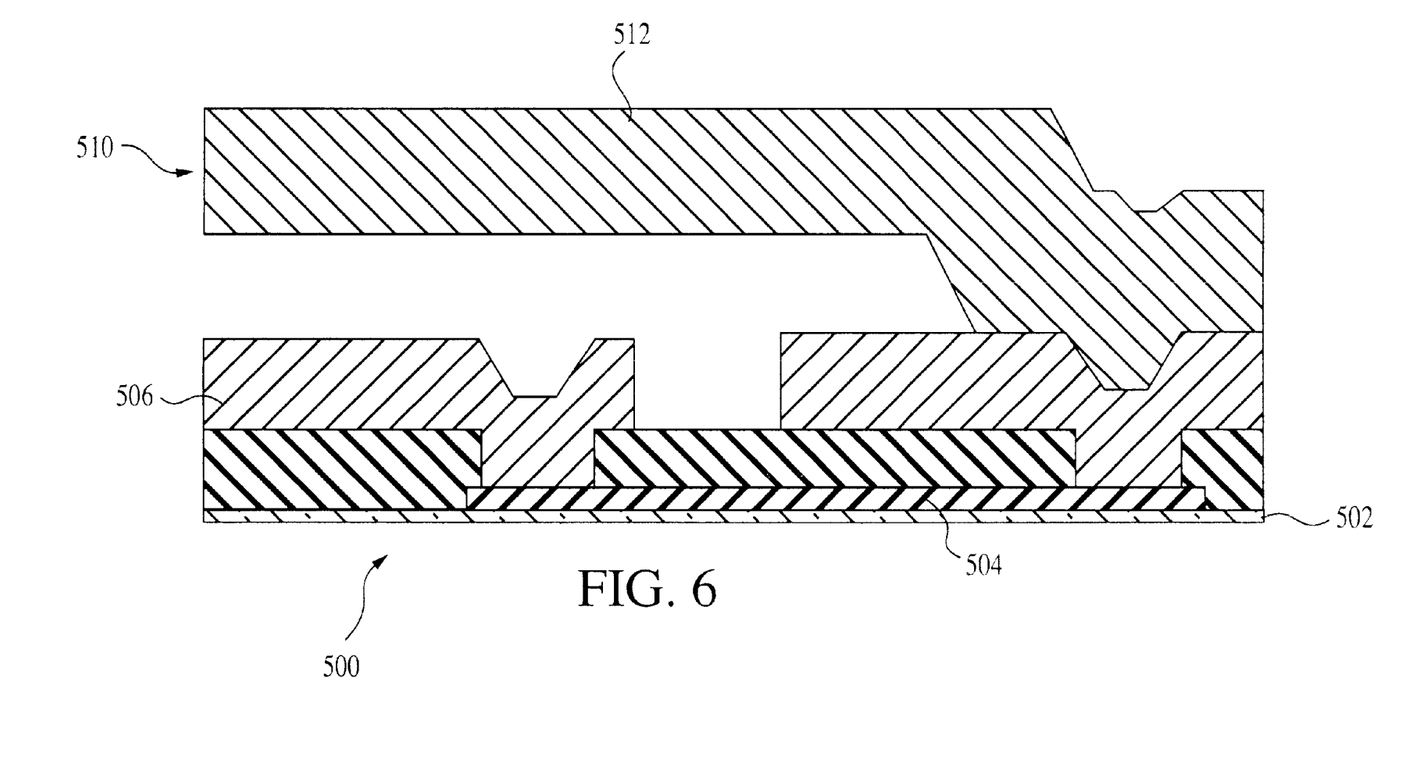
FIG. 6 illustrates a cross sectional view of a base strap according to one embodiment.

Base bias is set on each of the amplifier stages 410, 420 by way of base bias straps 480. A cross-section of a portion of the amplifier 400 through one of these base straps 480 is shown in FIG. 6. The amplifier portion 500 shown in FIG. 6 contains base straps 510 that include air bridges 512 that span elements on the substrate 502, similar to the collector straps 450 of FIG. 2. The symmetrical interstage feed 460 thus supplies input signals, which have already been amplified by the pre-amplifier 420, to the bases of the transistor cells of the second stage in order to be further amplified. The base straps 512 provide parallel contact between the base ballast resistors 502 that connect directly to the base terminals of each transistor cell in the amplifier cells 410, 420 in much the same manner that the collector straps provide parallel contact between the collectors. The base straps 512 may be formed using the same processing steps and materials as the collector straps 450.

Advantages may be achieved by use of a combination of the collector and base straps 450, 480 being disposed in a parallel fashion above the transistor cells. One advantage may be that the collector and base straps 450, 480 permit elimination of the conventional collector and base interconnects patterned onto the wafer. The first stage amplifier cells 420 and second stage amplifier cells 410 may be more compact, and the amount of area required for each amplifier cell 410, 420 decreased. This, in turn, may reduce the overall size of the die for a given amplifier 400, thereby saving valuable area on the die and allowing more die to be produced from a given wafer. Therefore, the amount of material necessary to fabricate the amplifier 400 may be reduced, decreasing both waste of the underlying material as well as manufacturing costs in producing the amplifiers 400. In the particular design of FIG. 4, for example, use of the collector and base straps reduced the die size by about 20% and about 13%, respectively. Note however that these numbers will vary with the specific layout. In addition, the decreased die size may permit smaller packaging options for the amplifier 400. The reduction in ground inductance for the amplifier may also result in amplifiers exhibiting higher available gains and may potentially improve the overall efficiency of the amplifier.

In one embodiment, while a dc voltage is provided that biases the bases of the transistor cells, in other applications, the dc voltage may be applied directly from a power supply. The bias circuit 430 is connected to resistive elements (e.g. base ballast resistors) 504, which are in turn connected to the bases of the transistor cells (not shown) via a first interconnect metal 506. The base ballast resistors 504 restrict current passing through the bases of the transistor cells from the dc current source, establishing the bias point of operation for the transistor cells, and insuring that thermal stability is maintained. The same pair of transistor cells that share a common collector contact also share a common ballast resistor in the embodiment, although the number of transistor cells that share each base ballast resistor is limited by thermal instability. In other applications, the number of base ballast resistors may be increased to the same number of transistor cells or decreased to higher ratios such as one resistor for every four transistor cells.

The base ballast resistors in the embodiment shown are fabricated from thin film resistor metal, specifically NiCr, although other suitable materials may also be used. Another method of realizing such resistors is to form the resistors in one of the epitaxial layers, such as the subcollector, base or emitter layer. For thin film resistors, one method of fabricating the resistors and connections to the resistors includes fabricating the resistors on the substrate through a patterned photoresist, which is subsequently removed. A passivation layer such as SiN is deposited on the resistors, another layer of photoresist is patterned, contact holes to the resistors are etched in the passivation layer, and the photoresist removed. The contact holes are disposed on opposing sides of each resistor, forming contact points on the resistor that have a substantial resistance therebetween. Another photoresist is deposited and patterned, metal forming interconnects to the transistor cells and an air bridge contact section is deposited and the photoresist removed. The interconnect metal is preferably fabricated using the same metal as that of base and collector straps, TiPtAu being one example. The air bridge contact section provides metallization for contact between the air bridge and the resistor. The base straps to the bias circuit are then formed, permitting parallel contact between the bias circuit and the bases of the transistor cells through the resistors. The fabrication of the base contacts may be accomplished simultaneously and in correspondence with that of other elements in the amplifier. The different metal and passivation layers used in formation of contact to the bases of the transistor cells may be sputtered, evaporated, coated, or otherwise fabricated. In addition, fabrication steps not explicitly mentioned may include cleaning of the wafer between various steps as desired, in addition to other conventional fabrication steps.

The same pair of transistor cells 302, 304 that share a common collector contact 308 and base ballast resistor 504 also share a common capacitor 470. The signal from the pre-amplifier 420 flows through the symmetric interstage feed 460 to the capacitor 470 and then the base 112 of the particular transistor cell 100 or pair of transistor cells. The symmetric interstage feed 460 is connected to common lower electrodes (not shown) that extend under each of the capacitors 470. The connections between the symmetric interstage feed 460 and the lower electrodes are disposed on either end of the symmetric interstage feed 460. The air bridge 480 that connects the bases 112 of the transistor cells 100 of different rows is disposed essentially above these connections. The sets of adjacent rows of capacitors 470 overlap a lower electrode. The capacitors 470 serve to block DC bias from the RF circuitry. Changing the number and value of the capacitors 470 allows tuning of the response in conjunction with the base ballast resistors 504 and are dependent on the device design (in addition to, for example, an external capacitor or inductor connected with the symmetric interstage feed via a bond pad). The top plate of the capacitor (not shown) is connected with the base of the associated pair of transistor cells.

As illustrated in FIGS. 4 and 5, the rows of transistor cells are separated either by a row of ground vias 490 or by rows of capacitors 470, both of which are in parallel with the rows of transistor cells. The emitters of the rows of transistor cells are connected with the ground vias 490 that are located adjacent to the transistor cells. The ground vias 490 of each row are connected by metallization to form thermal and electrical contact. Thus, as shown, extra area available from the use of the base straps 480 and collector straps 450 is employed to bring the ground plane of metallization closer to the row of transistors. This, in turn, increases the thermal conductivity of both the first and second stage amplifiers 410 and 420 as well as reduces the amount of inductance to ground (by virtue of closer proximity).

The ground vias are comprised of holes that are etched through the substrate and subsequently coated with metallization, thereby enabling electrical continuity to the backside ground plane (not shown), i.e. a ground plane disposed on a back side of the substrate. Generally, the ground vias are either of cylindrical or conical shape, however, other shapes such as rectangles or squares may be possible dependent on the specific process. The depth of the ground vias and thus thickness of the substrate in one embodiment is about 4 mils. Below about 4 mils, the substrate becomes exceedingly delicate and difficulty in assembly increases accordingly.

The additional metal of the ground vias, in combination with the collector strap arrangement and base sourcing improve the ability to remove the heat from the transistor cells as the semiconductor substrates exhibit relatively poor thermal conductivity in comparison with metals. Thus, in one embodiment, an improvement in the removal of the heat dissipated in the transistor is attained through increasing the number and size of ground vias. While in the embodiment shown, the ground vias are larger than the individual transistor cells and thereby fewer vias exist in each row than transistor cells, the size and number of vias are limited by the processing and mechanical substrate characteristics.

Another advantage of the increased metallization between the emitters and the ground is the reduction in the emitter electrode inductances. Electrically, the vias are equivalent to inductors and resistors to ground. Thus, with an increasing number of parallel vias, the parallel inductance and resistance decreases as Z/N, where Z is the inductance or resistance of a single via and N is the number of vias. This results in an improvement in the electrical stability of the circuit.

In addition, the use of the collector and base straps, thereby eliminating the collector and base interconnects fabricated along the surface of the substrate, allows the ground vias to be disposed closer to the transistor cells than in conventional amplifiers decreasing both the resistance and inductance. In one example, the distance between the transistor cells and ground vias is reduced from about 30 µm to about 10 µm, a decrease of the inductance to ground of 23%.

Generally, for a power amplifier, a lower ground inductance is preferred as the stability of the circuit improves with decreasing inductance. This allows the gain to be increased and the power-added efficiency (PAE), which is a function of gain, to increase correspondingly. Thus, the arrangement of FIG. 4 has a reduced inductance compared with similar structures containing base and collector interconnects fabricated on the substrate because the vias are in closer proximity to the transistor cells. The benefit of reduced inductance increases as either the periphery of the die increases or as the frequency of operation increases. Removing the collector and base straps from the surface of the substrate, as illustrated in FIG. 4, incurs an additional benefit that further increases the PAE because the GaAs substrate is a relatively lossy medium.

Although not shown, more than one row of transistor cells can be used that connect with the same collector pads. In this case, other collector straps originating at the collector pad would connect the collectors for those transistor cells in the subsequent rows. For additional rows of transistor cells, the same method as that for the collector connections would apply.

By way of example only, typical dimensions of the transistor cell include a pitch of the transistor cell in the direction of the cross-sectional view of FIG. 2 of about 20–30 $\mu$m and length of the transistor cell of about 30 $\mu$m. The thickness of the emitter interconnects are about 2.2 $\mu$m while that of the collector interconnects are typically about 3 $\mu$m. The air bridges are about 3 $\mu$m in thickness. The minimum distance between the air bridge and the highest point in the structure underneath, about 2–3 $\mu$m, occurs between the emitter interconnect atop the structure and the air bridge. The vias may be decreased to about 5 $\mu$m, but are nominally larger to permit improved heat dissipation from the circuit. The dimensions of the transistor cells, collector and base straps, and other components of the amplifier are dependent on the design characteristics and thus other dimensions may be fabricated as necessary.

In one embodiment of the amplifier for operation in specific cell phones, the amplifier provides amplification in about the 800 MHz to 2.5 GHz range. More specifically, in one embodiment, an amplifier is designed for efficient operation in about the 824–849 MHz range. For such an amplifier, the small signal and linear gains are typically about 29 dB, with the minimum output power being about 28.5 dBm, the adjacent channel power ratio is about −47 dBc, the linear efficiency is at least 35%, the CW output power is typically about 31.5 dBm, the CW efficiency is about 51%, and the quiescent current is about 100 mA.

In different embodiments, the semiconductor amplifier comprises at least one amplifier cell including a plurality of heterojunction bipolar transistors on a substrate and at least one collector strap that forms an air bridge over a set of the transistors. The semiconductor amplifier may alternately or in addition comprise vias that connect the emitters of the transistors with ground through the substrate. Similarly, semiconductor amplifier may alternately or in addition at least one base strap connecting resistive elements in the amplifier cell that also form an air bridge over the resistive elements. These embodiments produce a reduced size amplifier having increased heat dissipation and decreased ground inductance.

The present invention includes a high performance amplifier that can be used in handset cellular telephones and other devices. Other applications of the amplifier include use in a laser driver application for either high power application or for communications. While particular embodiments of the present invention have been shown and described, modifications may be made. It is therefore intended in the appended claims to cover such changes and modifications that follow in the true spirit and scope of the invention.

We claim:

1. A semiconductor amplifier comprising:
    a substrate;
    at least one amplifier cell including a plurality of transistor cells disposed on the substrate, each transistor cell having a collector;
    a ground plane disposed on a back side of the substrate, the at least one amplifier cell arranged on a front side of the substrate;
    a plurality of electrodes electrically connected with emitters of the transistor cells;
    a plurality of ground vias through the substrate adjacent to the transistor cells, the ground vias connected with the electrodes and allowing both direct (DC) and radiofrequency (RF) current flow to the ground plane;
    a contact pad that provides a signal output for the collectors of the transistor cells; and
    at least one collector strap that forms an air bridge over a set of the transistor cells, the collector strap electrically connecting the collectors and the contact pad.

2. The semiconductor amplifier according to claim 1, wherein the transistor cells are heterojunction bipolar transistor cells.

3. The semiconductor amplifier according to claim 1, wherein the transistor cells comprise:
    a subcollector disposed on the substrate, the collector in electrical contact with the subcollector;
    collector contact material in electrical contact with the subcollector, the collector contact material separated from the collector;
    a base in electrical contact with the collector;
    base contact material in electrical contact with the base;
    an emitter in electrical contact with the base and separate from the base contact material; and
    emitter contact material in electrical contact with the emitter, the at least one collector strap in contact with the collector contact material.

4. The semiconductor amplifier according to claim 1, wherein an adjacent pair of transistor cells share collector contact material and a subcollector.

5. The semiconductor amplifier according to claim 4, wherein one bridge of the collector strap is connected with collector contact material of a first adjacent pair of transistor cells and a neighboring second adjacent pair of transistor cells.

6. The semiconductor amplifier according to claim 5, wherein the one bridge of the collector strap spans one of the transistor cells of the first adjacent pair of transistor cells and one of the transistor cells of the second adjacent pair of transistor cells.

7. The semiconductor amplifier according to claim 1, further comprising:
    a pre-amplifier cell including transistor cells;
    a symmetrical interstage feed configured to receive a signal output of the pre-amplifier cell; and
    at least one collector strap providing electrical connections between collectors of the transistor cells in the pre-amplifier cell and the symmetrical interstage feed, wherein
        an output of the pre-amplifier cell is provided as an input to the at least one amplifier cell.

8. The semiconductor amplifier according to claim 1, wherein the transistor cells are arranged for even distribution of heat.

9. The semiconductor amplifier according to claim 1, wherein the amplifier comprises GaAs.

10. The semiconductor amplifier according to claim 1, wherein the transistor cells comprise individual mesa structures.

11. The semiconductor amplifier according to claim 1, wherein the emitters of a neighboring pair of transistor cells are connected through one of the electrodes to a corresponding via.

12. The semiconductor amplifier according to claim 1, wherein the transistor cells are aligned in rows and the vias are adjacent to every other row of the transistor cells.

13. The semiconductor amplifier according to claim 11, wherein the neighboring pair of transistor cells comprises one of the transistor cells of a first adjacent pair of transistor cells and one of the transistor cells of a second adjacent pair of transistor cells and adjacent pairs of transistor cells share collector contact material and a subcollector.

14. The semiconductor amplifier according to claim 13, wherein one bridge of the collector strap is connected with collector contact material of the neighboring pair of transistor cells.

15. The semiconductor amplifier according to claim 14, wherein the one bridge of the collector strap spans the neighboring pair of transistor cells.

16. The semiconductor amplifier according to claim 1, wherein the amplifier has fewer vias than transistor cells connected to the vias.

17. A semiconductor amplifier comprising:
   a substrate;
   at least one amplifier cell including a plurality of transistor cells disposed on the substrate, the transistor cells including bases;
   a plurality of resistive elements connected with the bases of the transistor cells; and
   at least one base strap connecting the resistive elements, the at least one base strap forming an air bridge over the resistive elements.

18. The semiconductor amplifier according to claim 17, wherein the transistor cells are heterojunction bipolar transistor cells.

19. The semiconductor amplifier according to claim 17, wherein adjacent pairs of transistor cells share one resistive element.

20. The semiconductor amplifier according to claim 17, wherein a set of the transistor cells each has an individual resistive element associated with the transistor.

21. The semiconductor amplifier according to claim 17, wherein the transistor cells comprise:
   a subcollector disposed on the substrate;
   a collector in electrical contact with the subcollector, the base in electrical contact with the collector;
   collector contact material in electrical contact with the subcollector, the collector contact material separated from the collector;
   base contact material in electrical contact with the base;
   an emitter in electrical contact with the base and separate from the base contact material; and
   emitter contact material in electrical contact with the emitter, the base strap in contact with the base contact material.

22. The semiconductor amplifier according to claim 17, further comprising a bias circuit that adjusts the base bias and provides thermal feedback to the bases, the base strap electrically connecting the resistive elements to the bias circuit.

23. The semiconductor amplifier according to claim 17, further comprising:
   capacitors connected with the bases of the transistor cells; and
   a symmetrical interstage feed configured to receive an input signal and configured to supply the input signal to the capacitors.

24. The semiconductor amplifier according to claim 23, further comprising a pre-amplifier cell configured to supply the input signal to the symmetrical interstage feed, the pre-amplifier cell including heterojunction bipolar transistor cells and at least one collector strap providing electrical connections between collectors of the transistor cells in the pre-amplifier cell and the symmetrical interstage feed.

25. The semiconductor amplifier according to claim 17, further comprising:
   a ground plane disposed on a back side of the substrate, the at least one amplifier cell arranged on a front side of the substrate;
   a plurality of electrodes electrically connected with emitters of the transistor cells; and
   a plurality of ground vias through the substrate, the ground vias connected with the electrodes and allowing at least one of direct (DC) and radio-frequency (RF) current flow to the ground plane.

26. The semiconductor amplifier according to claim 25, wherein the emitters of a neighboring pair of transistor cells are connected through one of the electrodes to a corresponding via.

27. The semiconductor amplifier according to claim 25, wherein the transistor cells are aligned in rows.

28. The semiconductor amplifier according to claim 27, wherein the vias are adjacent to every other row of the transistor cells.

29. The semiconductor amplifier according to claim 25, wherein the amplifier has fewer vias than transistor cells connected to the vias.

30. The semiconductor amplifier according to claim 17, wherein the transistor cells are arranged for even distribution of heat.

31. The semiconductor amplifier according to claim 17, wherein the amplifier comprises GaAs.

32. The semiconductor amplifier according to claim 17, wherein each transistor comprises an individual mesa structure.

33. The semiconductor amplifier according to claim 19, wherein at least one bridge of the base strap spans one of the resistive elements and an interconnect to the bases of a pair of transistor cells.

34. A semiconductor amplifier comprising:
   at least one amplifier cell including a plurality of transistor cells on a substrate;
   at least one collector strap that forms an air bridge over a set of the transistor cells and makes electrical connections between the collectors;
   a plurality of resistive elements connected with bases of the transistor cells; and
   at least one base strap connecting the resistive elements, the at least one base strap forming an air bridge over the resistive elements.

35. The semiconductor amplifier according to claim 34, wherein the transistor cells are heterojunction bipolar transistor cells.

36. The semiconductor amplifier according to claim 34, wherein an adjacent pair of transistor cells share collector contact material and a subcollector.

37. The semiconductor amplifier according to claim 36, wherein one bridge of the collector strap is connected with collector contact material of a first adjacent pair of transistor cells and a neighboring second adjacent pair of transistor cells.

38. The semiconductor amplifier according to claim 37, wherein the one bridge of the collector strap spans one of the transistor cells of the first adjacent pair of transistor cells and one of the transistor cells of the second adjacent pair of transistor cells.

39. The semiconductor amplifier according to claim 38, wherein the adjacent pairs of transistor cells share one resistive element.

40. The semiconductor amplifier according to claim 34, further comprising a bias circuit that adjusts the base bias and provides thermal feedback to the bases, the base strap electrically connecting the resistive elements to the bias circuit.

41. The semiconductor amplifier according to claim 34, further comprising:

capacitors connected with the bases of the transistor cells; and a symmetrical interstage feed configured to receive an input signal and configured to supply the input signal to the capacitors.

42. The semiconductor amplifier according to claim 41, further comprising a pre-amplifier cell configured to supply the input signal to the symmetrical interstage feed, the pre-amplifier cell including heterojunction bipolar transistor cells and at least one collector strap providing electrical connections between collectors of the transistor cells in the pre-amplifier cell and the symmetrical interstage feed.

43. The semiconductor amplifier according to claim 34, wherein at least one bridge of the base strap spans both one of the resistive elements and an interconnect to the bases of one pair of transistor cells.

44. The semiconductor amplifier according to claim 34, further comprising:

a ground plane disposed on a back side of the substrate, the at least one amplifier cell arranged on a front side of the substrate;

a plurality of electrodes electrically connected with emitters of the transistor cells; and a plurality of ground vias through the substrate, the ground vias connected with the electrodes and allowing both direct (DC) and radio-frequency (RF) current flow to the ground plane.

45. The semiconductor amplifier according to claim 44, wherein the emitters of a neighboring pair of transistor cells are connected through one of the electrodes to a corresponding via.

46. The semiconductor amplifier according to claim 45, wherein the neighboring pair of transistor cells comprises one of the transistor cells of a first adjacent pair of transistor cells and one of the transistor cells of a second adjacent pair of transistor cells, an adjacent pair of transistor cells share collector contact material and a subcollector.

47. The semiconductor amplifier according to claim 46, wherein one bridge of the collector strap is connected with collector contact material of the neighboring pair of transistor cells.

48. The semiconductor amplifier according to claim 47, wherein the one bridge of the collector strap spans the neighboring pair of transistor cells.

49. The semiconductor amplifier according to claim 48, wherein the adjacent pairs of transistor cells share one resistive element.

50. The semiconductor amplifier according to claim 43, wherein the transistor cells are aligned in rows.

51. The semiconductor amplifier according to claim 50, wherein the vias are adjacent to every other row of the transistor cells.

52. The semiconductor amplifier according to claim 34, wherein the amplifier comprises GaAs.

* * * * *